United States Patent
Chen et al.

(10) Patent No.: US 11,770,134 B2
(45) Date of Patent: Sep. 26, 2023

(54) METHODS AND APPARATUS FOR CRC CONCATENATED POLAR ENCODING

(71) Applicant: QUALCOMM Incorporated, San Diego, CA (US)

(72) Inventors: Kai Chen, Shenzhen (CN); Liangming Wu, Beijing (CN); Changlong Xu, Beijing (CN); Jing Jiang, San Diego, CA (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/512,289

(22) Filed: Oct. 27, 2021

(65) Prior Publication Data
US 2022/0140842 A1 May 5, 2022

Related U.S. Application Data

(63) Continuation of application No. 16/760,758, filed as application No. PCT/CN2018/107129 on Sep. 21, 2018, now Pat. No. 11,196,444.

(30) Foreign Application Priority Data

Nov. 7, 2017 (WO) ................ PCT/CN2017/109694

(51) Int. Cl.
*H03M 13/09* (2006.01)
*H03M 13/15* (2006.01)
(Continued)

(52) U.S. Cl.
CPC ......... *H03M 13/09* (2013.01); *H03M 13/155* (2013.01); *H03M 13/617* (2013.01); *H04L 1/0061* (2013.01); *H04L 1/0065* (2013.01)

(58) Field of Classification Search
CPC ... H04L 1/0041; H04L 1/0057; H04L 1/0061; H04L 1/0065; H03M 13/09;
(Continued)

(56) References Cited

U.S. PATENT DOCUMENTS 10,998,922 B2 * 5/2021 Koike-Akino ...... H03M 13/271
2014/0068391 A1 3/2014 Goel et al.
(Continued)

FOREIGN PATENT DOCUMENTS

CN 105227189 A 1/2016
CN 107124188 A 9/2017
(Continued)

OTHER PUBLICATIONS

Mediatek Inc: "Polar Code Design Features for Control Channels", 3GPP TSG RAN WG1 AH_NR Meeting, R1-1700168, Spokane, USA, Jan. 16-20, 2017, 8 Pages.
(Continued)

*Primary Examiner* — Shelly A Chase
(74) *Attorney, Agent, or Firm* — Patterson & Sheridan, LLP

(57) ABSTRACT

Certain aspects of the present disclosure generally relate to techniques for encoding and decoding bits of information using cyclic redundancy check (CRC) concatenated polar encoding and decoding. A method generally includes obtaining the bits of information to be transmitted. The method includes performing CRC outer encoding of the bits of information using an even-weighted generator polynomial to produce CRC encoded bits. The method includes performing polar inner encoding of the CRC encoded bits to generate a codeword. The method includes discarding a first code bit at a beginning of the codeword. The shortened codeword is transmitted over a wireless medium. In another method, bit-level scrambling is performed on the CRC
(Continued)

encoded bits before the polar encoding to. In another method, only odd-weighted generator polynomials are selected.

14 Claims, 16 Drawing Sheets

(51) Int. Cl.
*H03M 13/00* (2006.01)
*H04L 1/00* (2006.01)

(58) Field of Classification Search
CPC ............. H03M 13/155; H03M 13/617; H03M 13/2792; H03M 13/2906
See application file for complete search history.

(56) References Cited

U.S. PATENT DOCUMENTS

| | | | |
|---|---|---|---|
| 2014/0173376 A1 | 6/2014 | Jeong et al. | |
| 2014/0380114 A1* | 12/2014 | Alexeev | H03M 13/2906 714/755 |
| 2015/0295593 A1 | 10/2015 | Trifonov et al. | |
| 2016/0013810 A1 | 1/2016 | Gross et al. | |
| 2016/0182187 A1 | 6/2016 | Kim et al. | |
| 2017/0214416 A1 | 7/2017 | Ge et al. | |
| 2018/0278369 A1 | 9/2018 | Ge et al. | |
| 2019/0356341 A1 | 11/2019 | Ma et al. | |
| 2020/0162196 A1 | 5/2020 | Jeong et al. | |
| 2020/0186170 A1 | 6/2020 | Hui et al. | |
| 2020/0212937 A1 | 7/2020 | Li et al. | |
| 2020/0343909 A1 | 10/2020 | Chen et al. | |
| 2022/0052709 A1* | 2/2022 | Hui | H03M 13/2792 |

FOREIGN PATENT DOCUMENTS

| | | |
|---|---|---|
| EP | 3566348 A1 | 11/2019 |
| WO | 2017002794 A1 | 1/2017 |
| WO | 2017122045 A1 | 7/2017 |
| WO | 2018207155 A2 | 11/2018 |

OTHER PUBLICATIONS

Murata T., et al., "CRC Design for List Decoding of Polar Codes", The Institute of Electronics, Information and Communication Engineers Technical Report, Japan, Jan. 11, 2016, vol. 115, No. 396, pp. 179-182.

Ericsson: "Performance Comparison of Polar Code Candidates", 3GPP Draft, 3GPP TSG RAN WG1 Meeting #88bis, R1-1704316 Performance Comparison of Polar Code Candidates, 3rd Generation Partnership Project (3GPP), Mobile Competence Centre, 650, Route Des Lucioles, F-06921 Sophia-Antipolis Cedex, vol. RAN WG1. No. Spokane. USA, Apr. 3, 2017-Apr. 7, 2017, Apr. 2, 2017 (Apr. 2, 2017), XP051242468, pp. 1-12, Retrieved from the Internet: URL:http://www.3gpp.org/ftp/Meetings_3GPP_SYNC/RAN1/Docs/ [retrieved on Apr. 2, 2017] section 2.

Huawei, et al., "Polar Code Construction for NR", 3GPP TSG RAN WG1 Meeting #86bis, 3GPP Draft, R1-1608862, Polar Code Construction for NR, 3rd Generation Partnership Project (3GPP), Mobile Competence Centre, 650, Route Des Lucioles, F-06921 Sophia-Antipolis Cedex, France, vol. RAN WG1, No. Lisbon, Portugal, Oct. 10, 2016-Oct. 14, 2016, Oct. 14, 2016 (Oct. 14, 2016), 8 Pages, XP051159189, Oct. 9, 2016, Retrieved from the Internet: URL: https://www.3gpp.org/ftp/TSG_RAN/WG1_RL1/TSGR1_86b/Docs/R1-1608862.zip [retrieved on Oct. 1, 2016].

International Preliminary Report on Patentability—PCT/CN2017/109694, The International Bureau of WIPO—Geneva, Switzerland, dated May 22, 2020.

International Preliminary Report on Patentability—PCT/CN2018/107129, The International Bureau of WIPO—Geneva, Switzerland, dated May 22, 2020.

International Search Report and Written Opinion—PCT/CN2017/109694—ISA/EPO—dated Jul. 31, 2018.

International Search Report and Written Opinion—PCT/CN2018/107129—ISA/EPO—dated Dec. 13, 2018.

Qingshuang Z., et al., "Efficient CRC Concatenation Scheme for Polar Codes", Electronics Letters, IEE Stevenage, GB, vol. 53, No. 13, Jun. 22, 2017 (Jun. 22, 2017), 2 pages, XP006061942, ISSN: 0013-5194, DOI: 10.1049/EL.2017.0983, abstract, third col., figures 1,2.

Qualcomm Incorporated: "Consideration of UE ID Scrambling for DCI", 3GPP Draft, 3GPP TSG-RAN WG1 #90-Bis, R1-1718884 Consideration of UE ID Scrambling for DCI, 3rd Generation Partnership Project (3GPP), Mobile Competence Centre, 650, Route Des Lucioles, F-06921, Sophia-Antipolis Cedex, France, vol. RAN WG1, No. Prague, Czech Republic, Oct. 9, 2017-Oct. 13, 2017, Oct. 11, 2017 (Oct. 11, 2017), XP051353368, 11 Pages, Retrieved from the Internet: URL: http://www.3gpp.org/ftp/tsg_ran/WG1_RL1/TSGR1_90b/Docs/[retrieved on Oct. 11, 2017].

Samsung: "Consideration on Polar Codes for High Order Modulation", R1-1708050, 3GPP TSG RAN WG1 #89, May 19, 2017, 6 pages.

Samsung: "Polar Code Construction for PBCH", 3GPP Draft, 3GPP TSG RAN WG1 Meeting 90bis, R1-1717690_Polar Code Construction for PBCH, 3rd Generation Partnership Project (3GPP), Mobile Competence Centre, 650, Route Des Lucioles, F-06921 Sophia-Antipolis Cedex, France, vol. RAN WG1. No. Prague, CZ, Oct. 9, 2017-Oct. 13, 2017, Oct. 8, 2017 (Oct. 8, 2017), XP051340875, pp. 1-8, Retrieved from the Internet: URL:http://www.3gpp.org/ftp/Meetings_3GPP_SYNC/RAN1/Docs/ [retrieved on Oct. 8, 2017] section 2, figure 1.

Supplementary European Search Report—EP18875500—Search Authority—Munich—dated Sep. 21, 2021.

Supplementary Partial European Search Report—EP18875500—Search Authority—Munich—dated Jul. 7, 2021.

Tsofun Algorithm: "Study of Split-CRC Polar Code Construction for Early Termination", 3GPP Draft, 3GPP TSG RAN WG1 NR Ad-Hoc#2, R1-1711644—Study of Split-CRC Polar Code Construction for Early Termination, 3rd Generation Partnership Project (3GPP), Mobile Competence Centre, 650, Route Des Lucioles, F-06921 Sophi, vol. RAN WG1, No. Qingdao, China, Jun. 27, 2017-Jun. 30, 2017, Jun. 27, 2017 (Jun. 27, 2017), XP051305905, pp. 1-29, Retrieved from the Internet: URL:http://www.3gpp.org/ftp/tsg_ran/WG1_RL1/TSGR1_AH/NR_AH_1706/Docs/.

* cited by examiner

METHODS AND APPARATUS FOR CRC CONCATENATED POLAR ENCODING

CROSS-REFERENCE TO RELATED APPLICATION & PRIORITY CLAIM

This application is a continuation of U.S. application Ser. No. 16/760,758, filed Apr. 30, 2020, which is a national stage application under 35 U.S.C 371 of PCT/CN2018/107129, filed Sep. 21, 2018, which claims the benefit of and priority to PCT Application No. PCT/CN2017/109694, filed Nov. 7, 2017, herein incorporated by reference in their entireties as if fully set forth below and for all applicable purposes.

INTRODUCTION

Field of the Disclosure

Certain aspects of the present disclosure generally relate to encoding bits of information and, more particularly, to methods and apparatus for cyclic redundancy check (CRC) concatenated polar encoding.

DESCRIPTION OF RELATED ART

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., which may be referred to as a BS, 5G NB, next generation NodeB (gNB or gNodeB), transmission reception point (TRP), etc.). A BS or DU may communicate with a set of UEs on downlink channels (e.g., for transmissions from a BS or DU to a UE) and uplink channels (e.g., for transmissions from a UE to BS or DU).

These multiple access technologies have been adopted in various telecommunication standards to provide a common protocol that enables different wireless devices to communicate on a municipal, national, regional, and even global level. NR (e.g., new radio or 5G) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

Additionally, NR is expected to introduce new encoding and decoding schemes that improve transmission and reception of data. For example, Polar codes are currently being considered as a candidate for error-correction in next-generation wireless systems such as NR. Polar codes are a relatively recent breakthrough in coding theory, which have been proven to asymptotically (for code size N approaching infinity) achieve the Shannon capacity. However, while Polar codes perform well at large values of N, for lower values of N, polar codes suffer from poor minimum distance, leading to the development of techniques such as successive cancellation list (SCL) decoding, which leverage a simple outer code having excellent minimum distance, such as a CRC or parity-check, on top of a polar inner code, such that the combined code has excellent minimum distance.

However, as the demand for mobile broadband access continues to increase, there exists a need for further improvements in NR and LTE technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects of the present disclosure provide an apparatus for wireless communications. The apparatus generally includes at least one processor coupled with a memory and comprising at least one encoder circuit. The at least one encoder circuit is configured to obtain bits of information to be transmitted. The at least one encoder circuit is configured to perform cyclic redundancy check (CRC) outer encoding of the bits of information using an even-weighted generator polynomial to produce CRC encoded bits. The at least one encoder circuit is configured to perform polar inner encoding of the CRC encoded bits to generate a codeword. The at least one encoder circuit is configured to discard a first code bit at a beginning of the codeword to produce a shortened codeword. The apparatus includes a transmitter configured to transmit the shortened codeword in accordance with a wireless technology across a channel via one or more antenna elements situated proximate the transmitter.

Certain aspects of the present disclosure provide another apparatus for wireless communications. The apparatus generally includes at least one processor coupled with a memory and comprising at least one encoder circuit. The at least one encoder circuit is configured to obtain bits of information to be transmitted. The at least one encoder circuit is configured to perform CRC outer encoding of the bits of information using an even-weighted generator polynomial to produce CRC encoded bits. The at least one encoder circuit is configured to perform bit scrambling of the CRC encoded bits. The at least one encoder circuit is configured to perform polar inner encoding of the scrambled CRC encoded bits to generate a codeword. The apparatus includes a transmitter configured to transmit the codeword in accordance with a wireless technology across a channel via one or more antenna elements situated proximate the transmitter.

Certain aspects of the present disclosure provide another apparatus for wireless communications. The apparatus generally includes at least one processor coupled with a memory and comprising at least one encoder circuit. The at least one encoder circuit is configured to obtain bits of information to be transmitted. The at least one encoder circuit is configured to select only odd-weighted generator polynomials for performing CRC outer encoding of the bits of information to produce CRC encoded bits. The at least one encoder circuit is configured to perform polar inner encoding of the CRC encoded bits to generate a codeword. The apparatus includes a transmitter configured to transmit the codeword in accordance with a wireless technology across a channel via one or more antenna elements situated proximate the transmitter.

Certain aspects of the present disclosure provide a method for encoding bits of information. The method generally includes obtaining the bits of information to be transmitted. The method includes performing CRC outer encoding of the bits of information using an even-weighted generator polynomial to produce CRC encoded bits. The method includes performing polar inner encoding of the CRC encoded bits to generate a codeword. The method includes discarding a first code bit at a beginning of the codeword to produce a shortened codeword. The method includes transmitting the shortened codeword in accordance with a wireless technology across a channel via one or more antenna elements situated proximate a transmitter Certain aspects of the present disclosure provide another method for encoding bits of information. The method generally includes obtaining the bits of information to be transmitted. The method includes performing CRC outer encoding of the bits of information using an even-weighted generator polynomial to produce CRC encoded bits. The method includes performing bit scrambling of the CRC encoded bits. The method includes performing polar inner encoding of the scrambled CRC encoded bits to generate a codeword. The method includes transmitting the codeword in accordance with a wireless technology across a channel via one or more antenna elements situated proximate a transmitter.

Certain aspects of the present disclosure provide another method for encoding bits of information. The method generally includes obtaining the bits of information to be transmitted. The method includes selecting only odd-weighted generator polynomials for performing CRC outer encoding of the bits of information to produce CRC encoded bits. The method includes performing polar inner encoding of the CRC encoded bits to generate a codeword. The method includes transmitting the codeword in accordance with a wireless technology across a channel via one or more antenna elements situated proximate a transmitter.

Certain aspects of the present disclosure provide an apparatus for wireless communications. The apparatus generally includes means for obtaining bits of information to be transmitted. The apparatus includes means for performing CRC outer encoding of the bits of information using an even-weighted generator polynomial to produce CRC encoded bits. The apparatus includes means for performing polar inner encoding of the CRC encoded bits to generate a codeword. The apparatus includes means for discarding a first code bit at a beginning of the codeword to produce a shortened codeword. The apparatus includes means for transmitting the shortened codeword in accordance with a wireless technology across a channel via one or more antenna elements situated proximate a transmitter Certain aspects of the present disclosure provide another apparatus for wireless communications. The apparatus generally includes means for obtaining bits of information to be transmitted. The apparatus includes means for performing CRC outer encoding of the bits of information using an even-weighted generator polynomial to produce CRC encoded bits. The apparatus includes means for performing bit scrambling of the CRC encoded bits. The apparatus includes means for performing polar inner encoding of the scrambled CRC encoded bits to generate a codeword. The apparatus includes means for transmitting the codeword in accordance with a wireless technology across a channel via one or more antenna elements situated proximate a transmitter.

Certain aspects of the present disclosure provide another apparatus for wireless communications. The apparatus generally includes means for obtaining bits of information to be transmitted. The apparatus includes means for selecting only odd-weighted generator polynomials for performing CRC outer encoding of the bits of information to produce CRC encoded bits. The apparatus includes means for performing polar inner encoding of the CRC encoded bits to generate a codeword. The apparatus includes means for transmitting the codeword in accordance with a wireless technology across a channel via one or more antenna elements situated proximate a transmitter.

Certain aspects of the present disclosure provide a computer readable medium having computer executable code stored thereon for wireless communications. The computer readable medium generally includes code for obtaining bits of information to be transmitted. The computer readable medium includes code for performing CRC outer encoding of the bits of information using an even-weighted generator polynomial to produce CRC encoded bits. The computer readable medium includes code for performing polar inner encoding of the CRC encoded bits to generate a codeword. The computer readable medium includes code for discarding a first code bit at a beginning of the codeword to produce a shortened codeword. The computer readable medium includes code for transmitting the shortened codeword in accordance with a wireless technology across a channel via one or more antenna elements situated proximate a transmitter Certain aspects of the present disclosure provide a computer readable medium having computer executable code stored thereon for wireless communications. The computer readable medium generally includes code for obtaining bits of information to be transmitted. The computer readable medium includes code for performing CRC outer encoding of the bits of information using an even-weighted generator polynomial to produce CRC encoded bits. The computer readable medium includes code for performing bit scrambling of the CRC encoded bits. The computer readable medium includes code for performing polar inner encoding of the scrambled CRC encoded bits to generate a codeword. The computer readable medium includes code for transmitting the codeword in accordance with a wireless technology across a channel via one or more antenna elements situated proximate a transmitter.

Certain aspects of the present disclosure provide a computer readable medium having computer executable code stored thereon for wireless communications. The computer readable medium generally includes code for obtaining bits of information to be transmitted. The computer readable medium includes code for selecting only odd-weighted generator polynomials for performing CRC outer encoding of the bits of information to produce CRC encoded bits. The computer readable medium includes code for performing polar inner encoding of the CRC encoded bits to generate a codeword. The computer readable medium includes code for transmitting the codeword in accordance with a wireless technology across a channel via one or more antenna elements situated proximate a transmitter.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

FIG. 14 is a block diagram illustrating a CRC concatenated polar encoder using only odd-weighted CRC generator polynomials, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
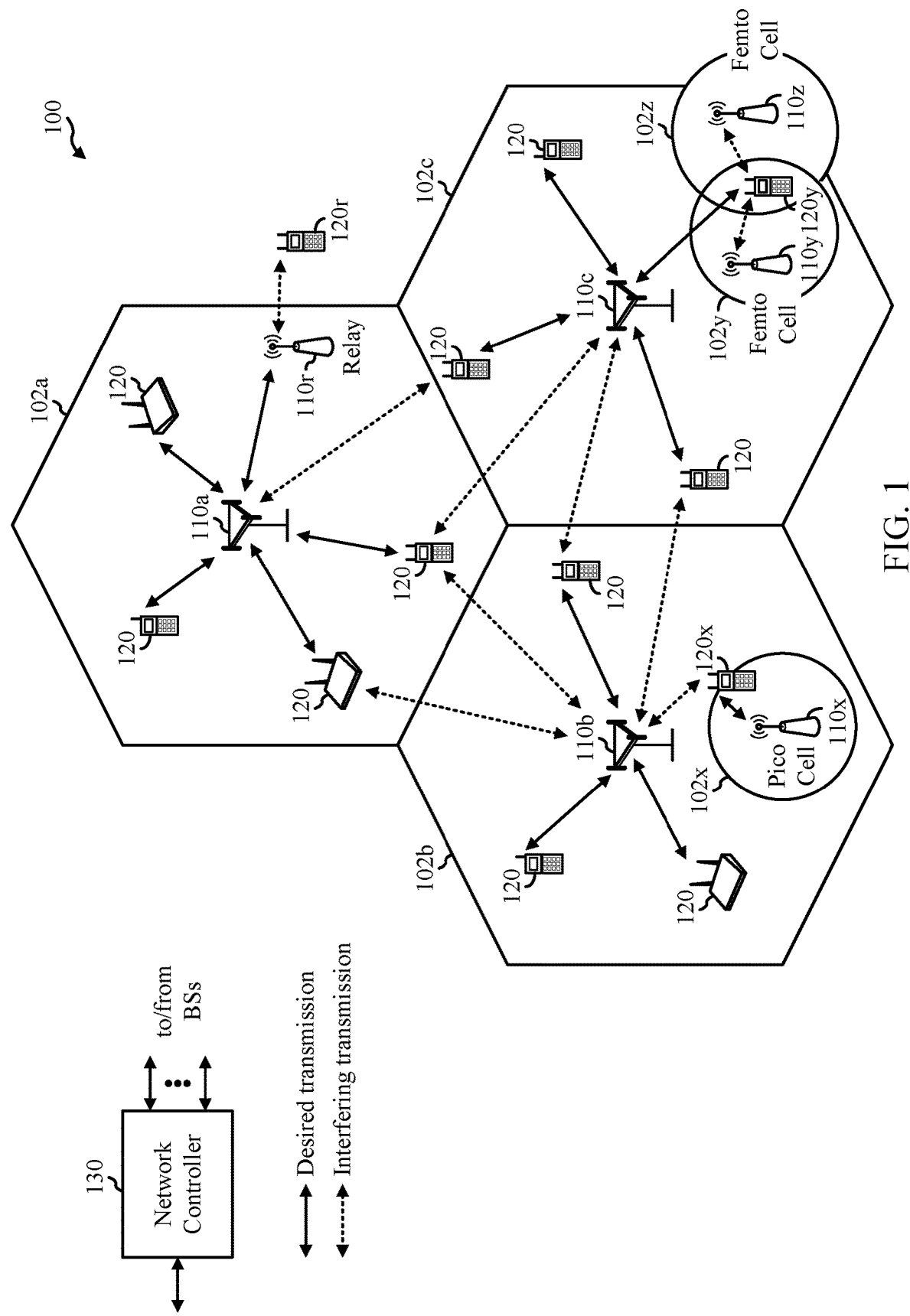
FIG. 1 is a block diagram conceptually illustrating an example telecommunications system, in accordance with certain aspects of the present disclosure.

Aspects of the present disclosure provide apparatus, methods, processing systems, and computer readable mediums for encoding/decoding, and more particularly to encoding and decoding using cyclic redundancy check (CRC) concatenated polar codes.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. for example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as universal terrestrial radio access (UTRA), cdma2000, etc. UTRA includes wideband CDMA (WCDMA) and other variants of CDMA. cdma2000 covers IS-2000, IS-95 and IS-856 standards. A TDMA network may implement a radio technology such as global system for mobile communications (GSM). An OFDMA network may implement a radio technology such as NR (e.g. 5G RA), evolved UTRA (E-UTRA), ultra mobile broadband (UMB), IEEE 802.11 (Wi-Fi), IEEE 802.16 (WiMAX), IEEE 802.20, Flash-OFDMA, etc. UTRA and E-UTRA are part of universal mobile telecommunication system (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied In other generation-based communication systems, such as 5G and later, including NR technologies.

New radio (NR) access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communications System

FIG. 1 illustrates an example wireless communication network 100 in which aspects of the present disclosure may be performed. For example, the wireless communication network 100 may be a New Radio (NR) or 5G network. A transmitting device in the wireless communication network 100, such as a UE 120 on the uplink or a BS 110 on the downlink, may be configured to cyclic redundancy check (CRC) polar encoding. If the transmitting device uses an even-weighted CRC generator polynomial, then the resulting CRC codeword is also even-weighted, leading to a cascaded polar output in which the first bit is a dummy bit, independent to the message. Accordingly, the transmitting device may avoid transmission of the dummy bit by using only odd-weighted CRC generator polynomials, dropping the first bit, or applying bit level scrambling to the CRC output before the polar encoding.

As illustrated in FIG. 1, the wireless communication network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B (NB) and/or a NB subsystem serving this coverage area, depending on the context in which the term is used. In NR systems, the term "cell" and next generation NodeB (gNB or gNodeB), NR BS, 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

In some examples, access to the air interface may be scheduled. A scheduling entity (e.g., a BS) allocates resources for communication among some or all devices and equipment within its service area or cell. the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. in some examples, a UE may function as a scheduling entity and may schedule resources for one or more subordinate entities (e.g., one or more other UEs), and the other UEs may utilize the resources scheduled by the UE for wireless communication. In some examples, A UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
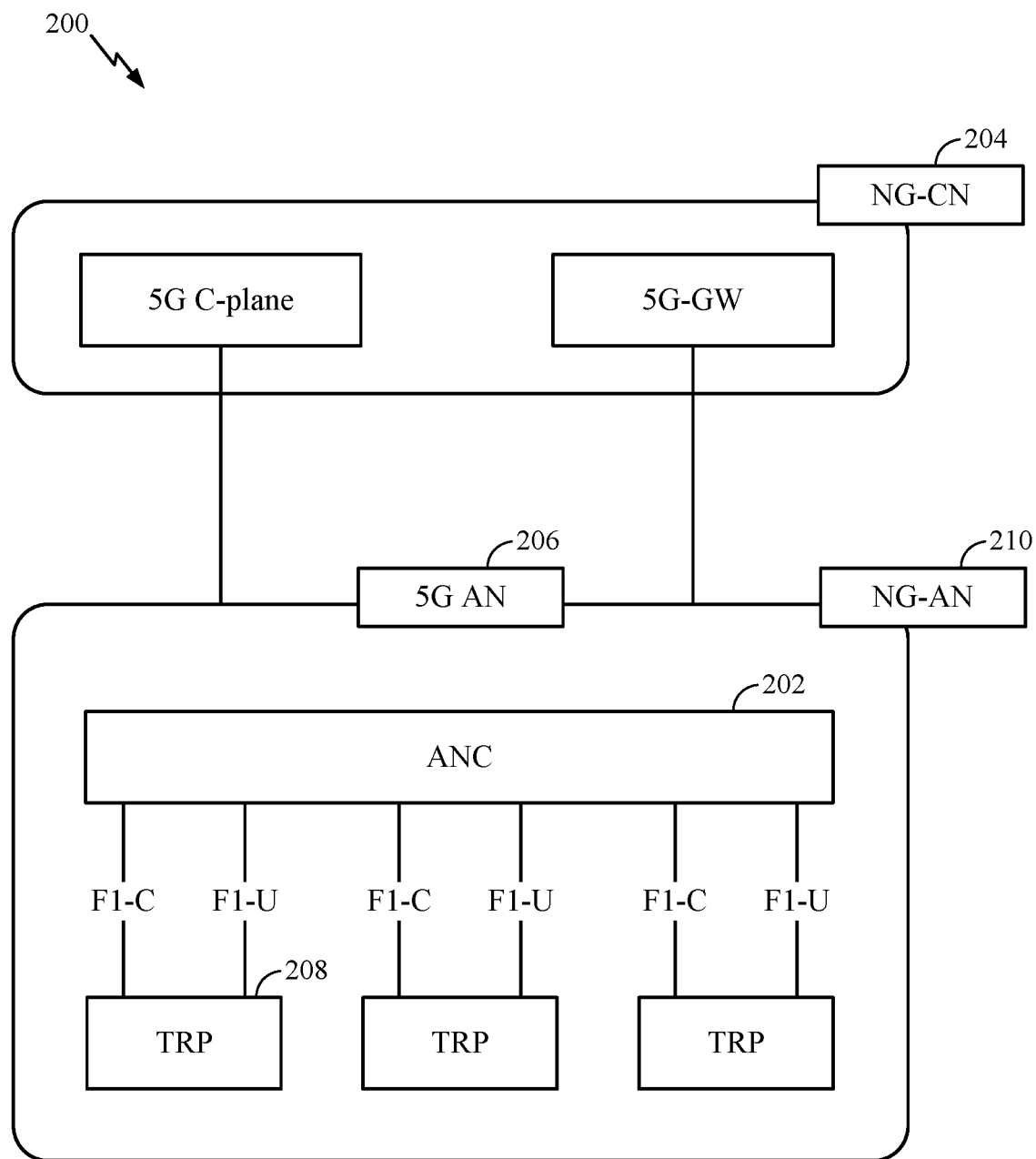
FIG. 2 is a block diagram illustrating an example logical architecture of a distributed radio access network (RAN), in accordance with certain aspects of the present disclosure.

FIG. 2 illustrates an example logical architecture of a distributed radio access network (RAN) 200, which may be implemented in the wireless communication network 100 illustrated in FIG. 1. A 5G access node 206 may include an access node controller (ANC) 202. ANC 202 may be a central unit (CU) of the distributed RAN 200. The backhaul interface to the next generation core network (NG-CN) 204 may terminate at ANC 202. The backhaul interface to neighboring next generation access nodes (NG-ANs) 210 may terminate at ANC 202. ANC 202 may include one or more TRPs 208 (e.g., cells, BSs, gNBs, etc.).

The TRPs 208 may be a distributed unit (DU). TRPs 208 may be connected to a single ANC (e.g., ANC 202) or more than one ANC (not illustrated). For example, for RAN sharing, radio as a service (RaaS), and service specific AND deployments, TRPs 208 may be connected to more than one ANC. TRPs 208 may each include one or more antenna ports. TRPs 208 may be configured to individually (e.g., dynamic selection) or jointly (e.g., joint transmission) serve traffic to a UE.

The logical architecture of distributed RAN 200 may support fronthauling solutions across different deployment types. For example, the logical architecture may be based on transmit network capabilities (e.g., bandwidth, latency, and/or jitter).

The logical architecture of distributed RAN 200 may share features and/or components with LTE. For example, next generation access node (NG-AN) 210 may support dual connectivity with NR and may share a common fronthaul for LTE and NR.

The logical architecture of distributed RAN 200 may enable cooperation between and among TRPs 208, for example, within a TRP and/or across TRPs via ANC 202. An inter-TRP interface may not be used.

Logical functions may be dynamically distributed in the logical architecture of distributed RAN 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU (e.g., TRP 208) or CU (e.g., ANC 202).

Figure 3:
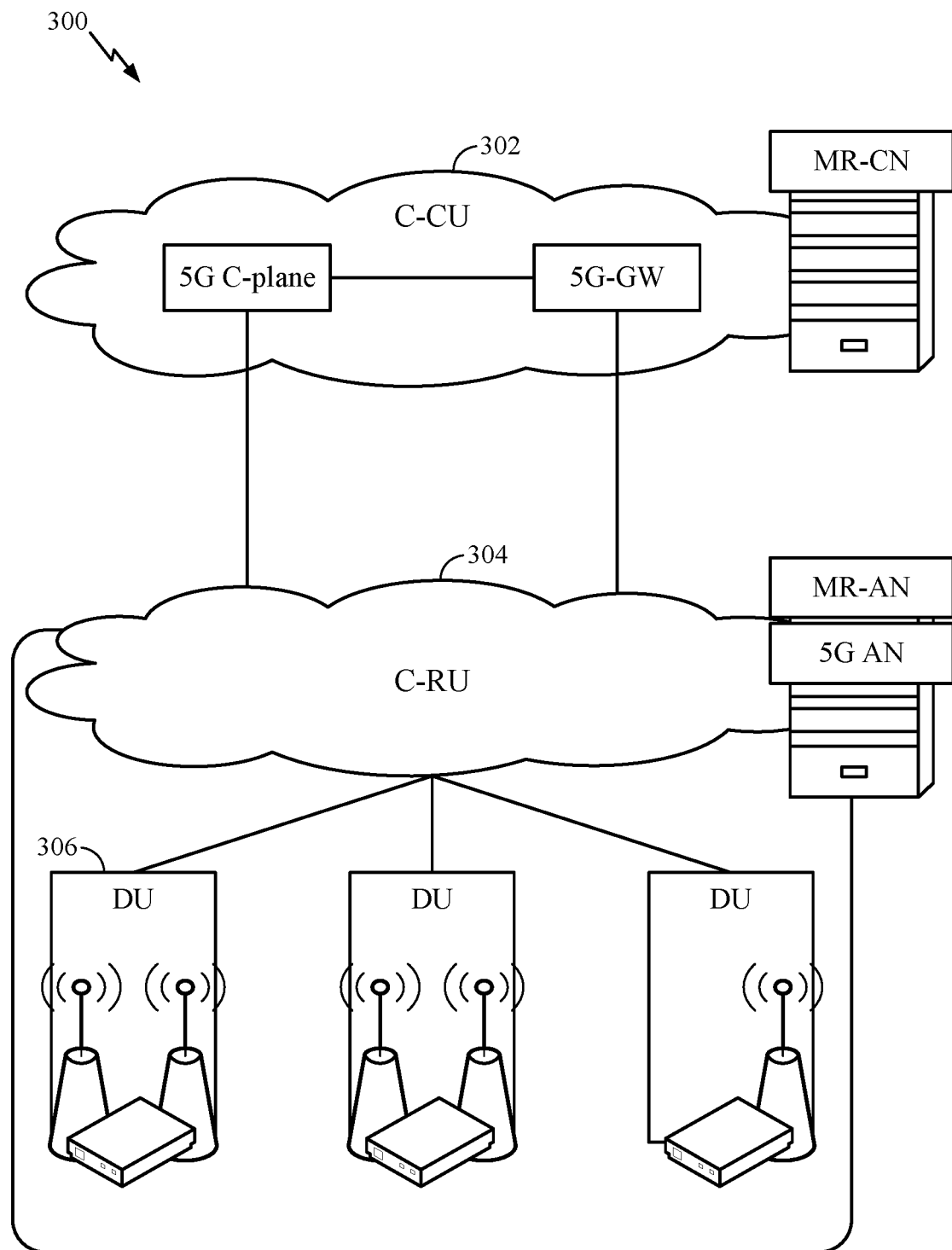
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. C-CU 302 may be centrally deployed. C-CU 302 functionality may be offloaded (e.g., to advanced wireless services (AWS)), in an effort to handle peak capacity.

A centralized RAN unit (C-RU) 304 may host one or more ANC functions. Optionally, The C-RU 304 may host core network functions locally. The C-RU 304 may have distributed deployment. The C-RU 304 may be close to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
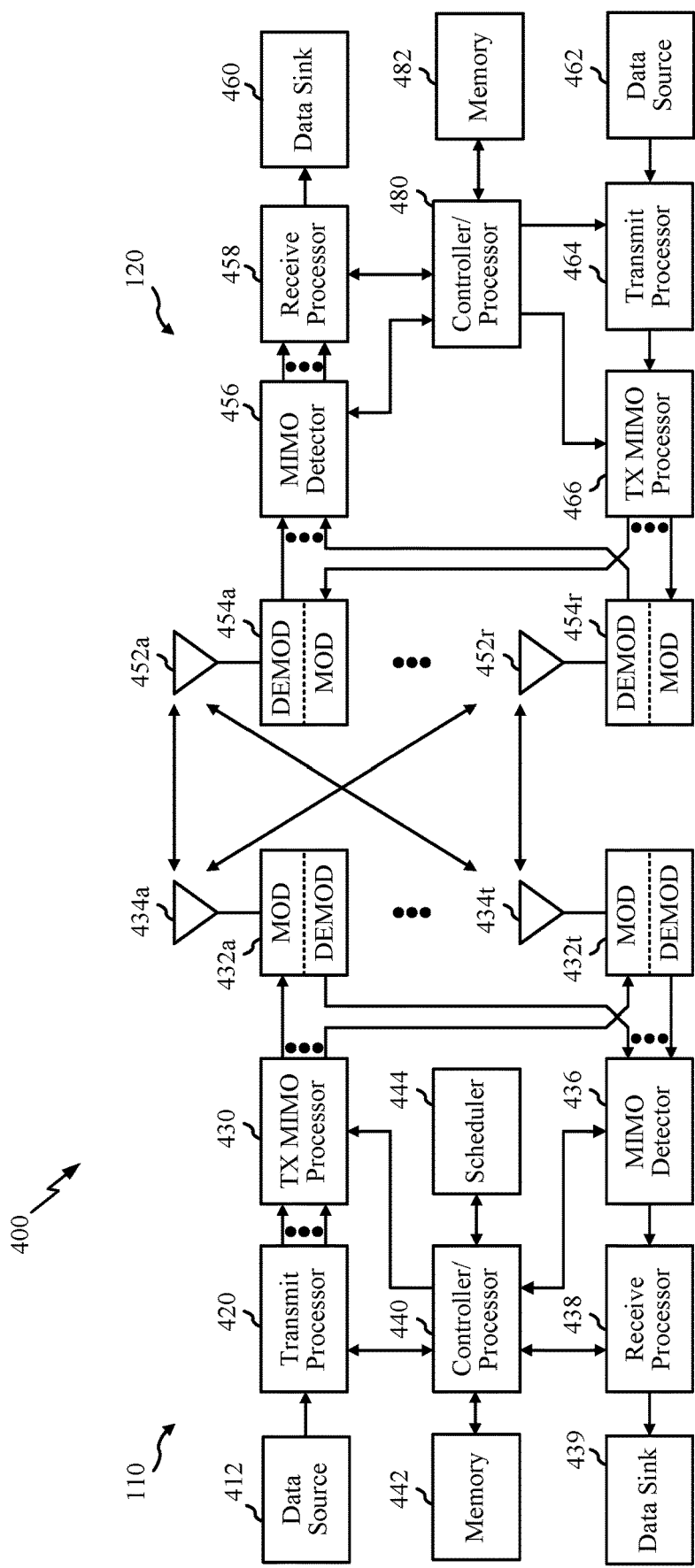
FIG. 4 is a block diagram conceptually illustrating a design of an example base station (BS) and user equipment (UE), in accordance with certain aspects of the present disclosure.

FIG. 4 illustrates example components of BS 110 and UE 120 (as depicted in FIG. 1), which may be used to implement aspects of the present disclosure. For example, antennas 452, processors 466, 458, 464, and/or controller/processor 480 of the UE 120 and/or antennas 434, processors 420, 430, 438, and/or controller/processor 440 of the BS 110 may be used to perform the various techniques and methods described herein for CRC concatenated polar codes.

At the BS 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), group common PDCCH (GC PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the primary synchronization signal (PSS), secondary synchronization signal (SSS), and cell-specific reference signal (CRS). A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) in transceivers 454a through 454r, respectively. Each demodulator 454 may condition (e.g., filter, amplify, downconvert, and digitize) a respective received signal to obtain input samples. Each demodulator may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal (e.g., for the sounding reference signal (SRS)). The symbols from the transmit processor 464 may be precoded by a TX MIMO processor 466 if applicable, further processed by the demodulators in transceivers 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the BS 110 and the UE 120, respectively. The processor 440 and/or other processors and modules at the BS 110 may perform or direct the execution of processes for the techniques described herein. The memories 442 and 482 may store data and program codes for BS 110 and UE 120, respectively. A scheduler 444 may schedule UEs for data transmission on the downlink and/or uplink.

Figure 5:
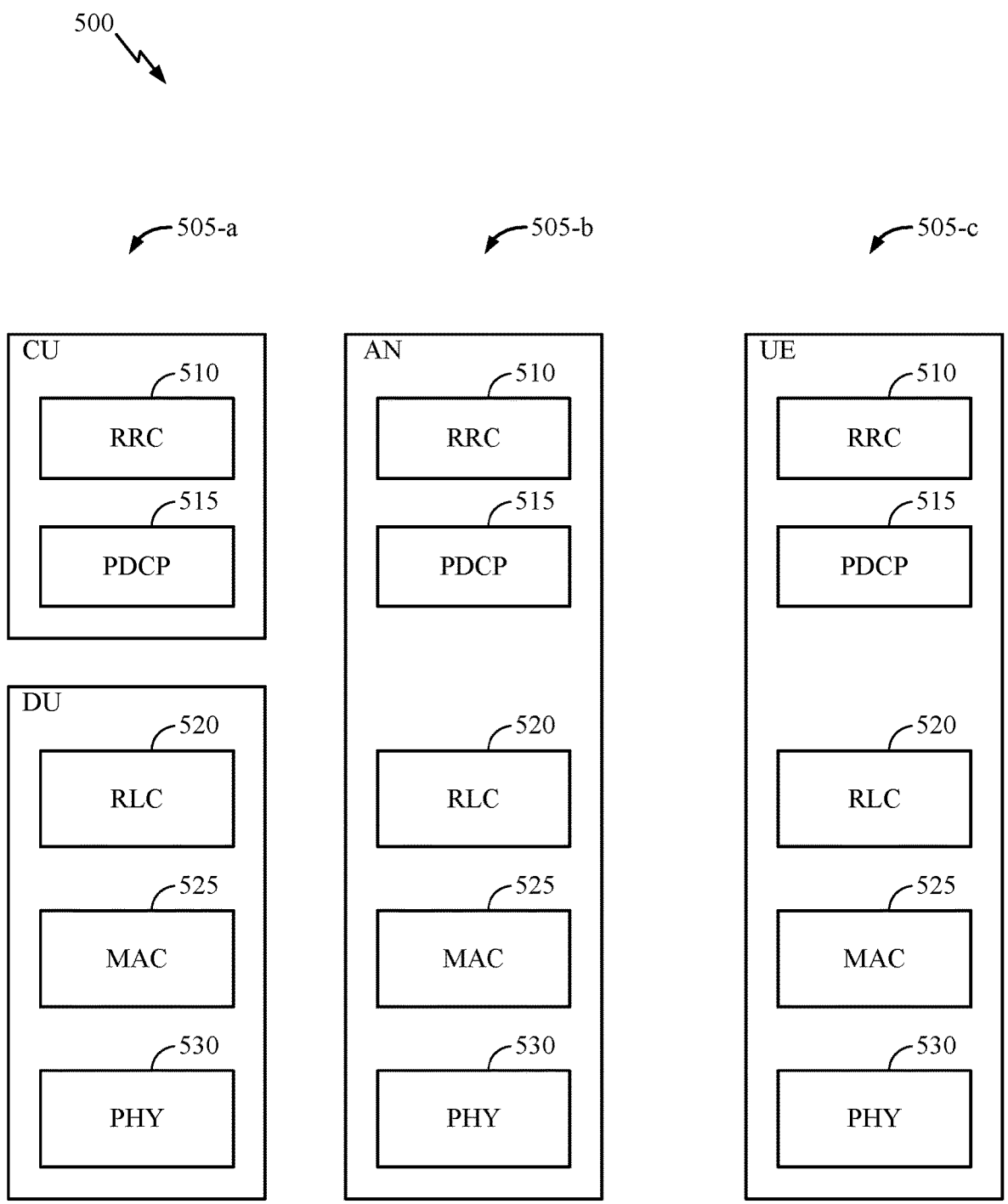
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a wireless communication system, such as a 5G system (e.g., a system that supports uplink-based mobility). Diagram 500 illustrates a communications protocol stack including a RRC layer 510, a PDCP layer 515, a RLC layer 520, a MAC layer 525, and a PHY layer 530. In various examples, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., TRP 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device. In the second option, RRC layer 510, PDCP layer 515, RLC layer 520, MAC layer 525, and PHY layer 530 may each be implemented by the AN. The second option 505-b may be useful in, for example, a femto cell deployment.

Regardless of whether a network access device implements part or all of a protocol stack, a UE may implement an entire protocol stack as shown in 505-c (e.g., the RRC layer 510, the PDCP layer 515, the RLC layer 520, the MAC layer 525, and the PHY layer 530).

In LTE, the basic transmission time interval (TTI) or packet duration is the 1 ms subframe. In NR, a subframe is still 1 ms, but the basic TTI is referred to as a slot. A subframe contains a variable number of slots (e.g., 1, 2, 4, 8, 16, . . . slots) depending on the subcarrier spacing. The NR RB is 12 consecutive frequency subcarriers. NR may support a base subcarrier spacing of 15 KHz and other subcarrier spacing may be defined with respect to the base subcarrier spacing, for example, 30 kHz, 60 kHz, 120 kHz, 240 kHz, etc. The symbol and slot lengths scale with the subcarrier spacing. The CP length also depends on the subcarrier spacing.

Figure 6:
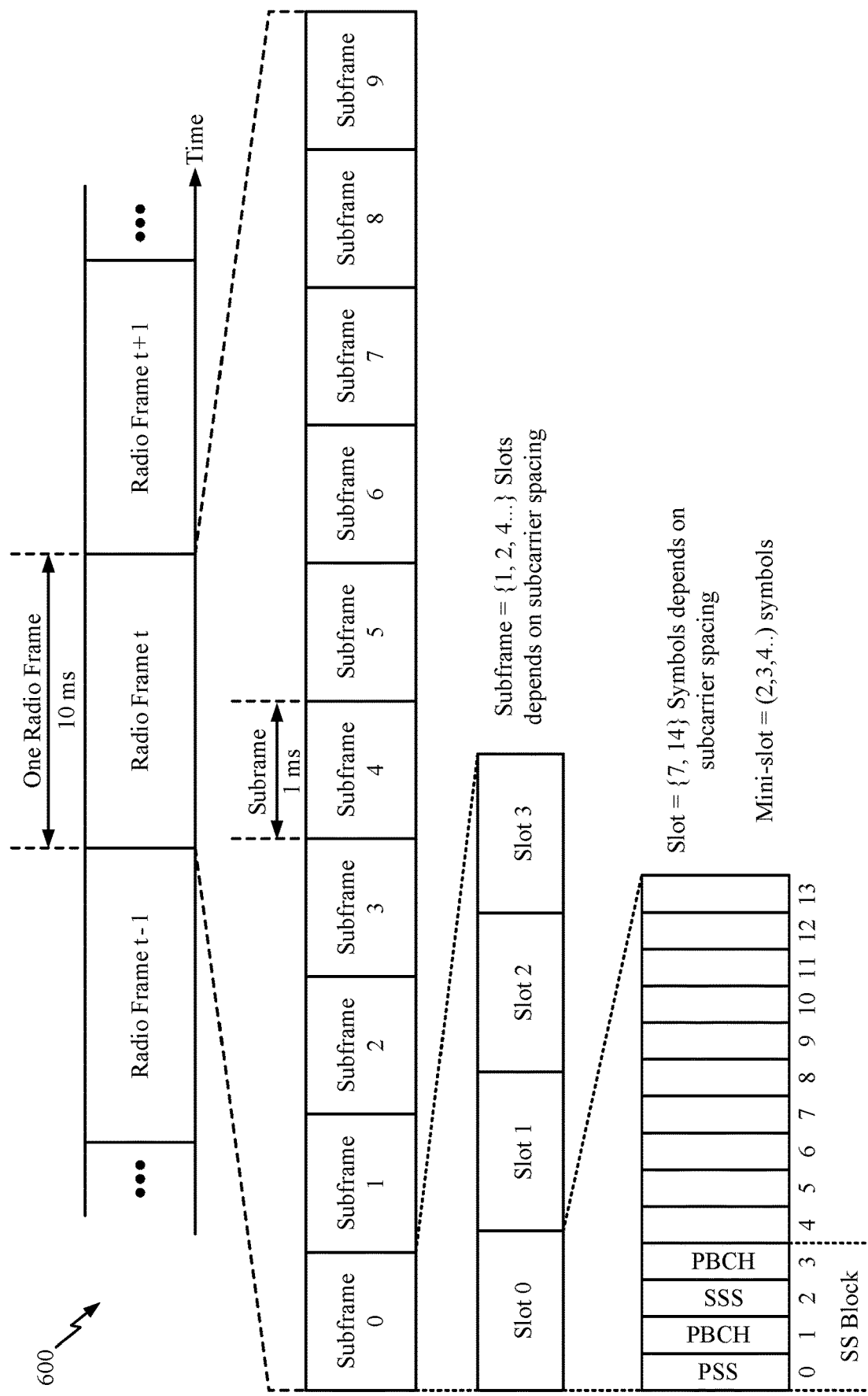
FIG. 6 illustrates an example of a frame format for a new radio (NR) system, in accordance with certain aspects of the present disclosure.

FIG. 6 is a diagram showing an example of a frame format 600 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. Each subframe may include a variable number of slots depending on the subcarrier spacing. Each slot may include a variable number of symbol periods (e.g., 7 or 14 symbols) depending on the subcarrier spacing. The symbol periods in each slot may be assigned indices. A mini-slot, which may be referred to as a sub-slot structure, refers to a transmit time interval having a duration less than a slot (e.g., 2, 3, or 4 symbols).

Each symbol in a slot may indicate a link direction (e.g., DL, UL, or flexible) for data transmission and the link direction for each subframe may be dynamically switched. The link directions may be based on the slot format. Each slot may include DL/UL data as well as DL/UL control information.

In NR, a synchronization signal (SS) block is transmitted. The SS block includes a PSS, a SSS, and a two symbol PBCH. The SS block can be transmitted in a fixed slot location, such as the symbols 0-3 as shown in FIG. 6. The PSS and SSS may be used by UEs for cell search and acquisition. The PSS may provide half-frame timing, the SS may provide the CP length and frame timing. The PSS and SSS may provide the cell identity. The PBCH carries some basic system information, such as downlink system bandwidth, timing information within radio frame, SS burst set periodicity, system frame number, etc. The SS blocks may be organized into SS bursts to support beam sweeping. Further system information such as, remaining minimum system information (RMSI), system information blocks (SIBs), other system information (OSI) can be transmitted on a physical downlink shared channel (PDSCH) in certain subframes. The SS block can be transmitted up to sixty-four times, for example, with up to sixty-four different beam directions for mmW. The up to sixty-four transmissions of the SS block are referred to as the SS burst set. SS blocks in an SS burst set are transmitted in the same frequency region, while SS blocks in different SS bursts sets can be transmitted at different frequency locations.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example CRC Concatenated Polar Coding

Figure 7:
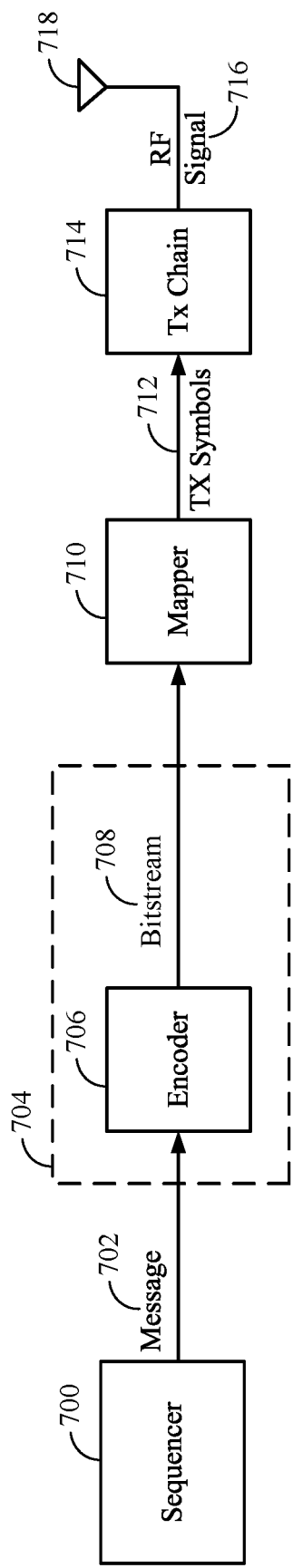
FIG. 7 is a block diagram illustrating an encoder, in accordance with certain aspects of the present disclosure.

FIG. 7 illustrates a portion of a radio frequency (RF) modem 704 that may be configured to provide an encoded message for wireless transmission (e.g., using CRC concatenated polar codes described below). In one example, an encoder in a transmitting device, such as a base station (e.g., BS 110) on the downlink or a UE (e.g., UE 120) on the uplink, receives a message 702 for transmission. The message 702 may contain data (e.g., information bits) and/or encoded voice or other content directed to the receiving device. The encoder 706 encodes the message using a suitable modulation and coding scheme (MCS), typically selected based on a configuration defined by the BS 110 or another network entity. In some cases, the encoder 706 may be configured to encode the message 702 using techniques presented herein. The encoded bitstream 708 (e.g., representing to the encoded message 702) may then be provided to a mapper 710 that generates a sequence of Tx symbols 712 that are modulated, amplified and otherwise processed by Tx chain 714 to produce an RF signal 716 for transmission through antenna 718.

Figure 8:
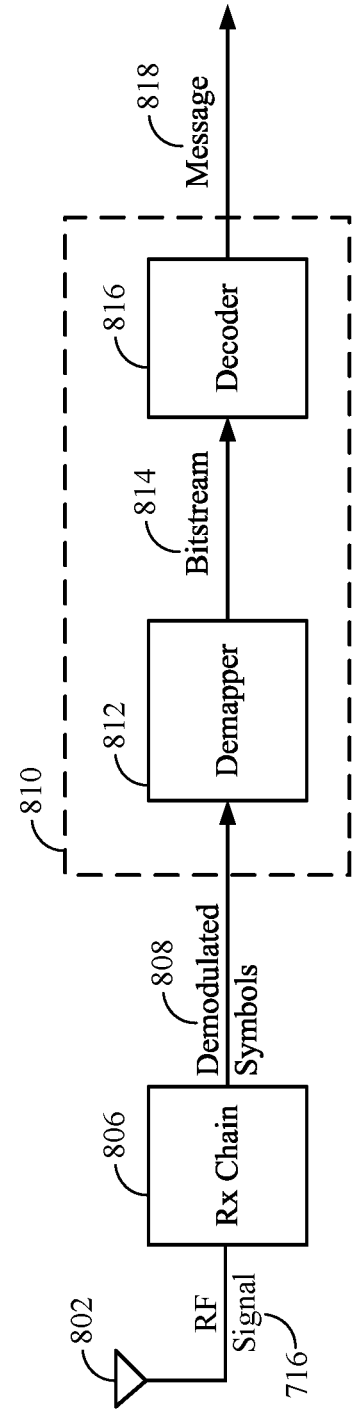
FIG. 8 is a block diagram illustrating a decoder, in accordance with certain aspects of the present disclosure.

FIG. 8 illustrates a portion of a RF modem 810 that may be configured to receive and decode a wirelessly transmitted signal including an encoded message (e.g., a message encoded using techniques presented herein). In various examples, the modem 810 receiving the signal may reside at the receiving device, such as the UE 120 on the downlink or the BS 110 on the uplink, or at any other suitable apparatus or means for carrying out the described functions. An antenna 802 provides the RF signal 716 to the receiving device. An Rx chain 806 processes and demodulates the RF signal 716 and may provide a sequence of symbols 808 to a demapper 812, which produces a sequence of a-priori probabilities as bitstream 814, often represented as log-likelihood ratios (LLRs) corresponding to the encoded message. A decoder 816 may then be used to decode m-bit information strings from a bitstream that has been encoded using a coding scheme (e.g., as described herein). The decoder 816 may comprise a CRC concatenated polar decoder.

Figure 9:
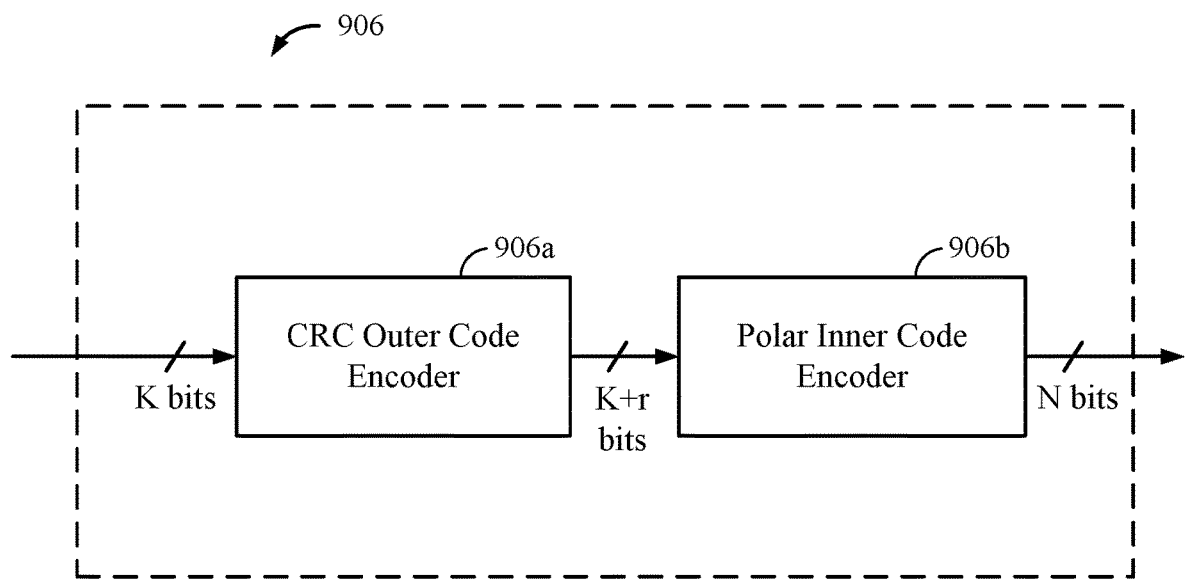
FIG. 9 is a block diagram illustrating a cyclic redundancy check (CRC) concatenated polar encoder, in accordance with certain aspects of the present disclosure.
Figure 10:
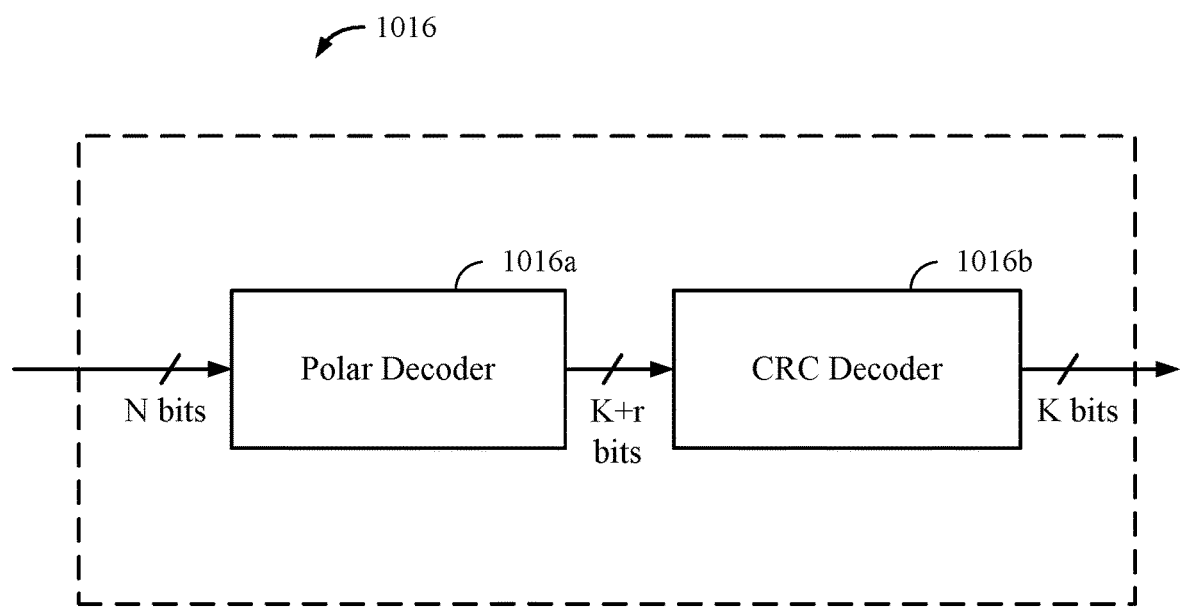
FIG. 10 is a block diagram illustrating a CRC concatenated polar decoder, in accordance with certain aspects of the present disclosure.

According to certain aspects, the encoder 706 may be a CRC concatenated polar encoder. As shown in FIG. 9, encoder 906 may include a CRC outer code encoder 906a and polar inner code encoder 906b. The encoder 906 may receive the payload of K information bits to be transmitted and the CRC outer code encoder 906a may add CRC bits and output K+r CRC encoded bits to the polar inner code encoder 906b. The polar inner code encoder 906b uses polar code and produces N polar encoded bits. Similarly, decoder 1016 may include a polar decoder 1016a and CRC decoder 1016b as shown in FIG. 10.

Polar codes have been adopted for error-correction in NR systems. Polar codes may be used to encode a stream of bits for transmission. Polar codes are a capacity-achieving coding scheme with almost linear (in block length) encoding and decoding complexity. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix G is constructed using the $n^{th}$ Kronecker power of the kernel matrix $$G_2 = \begin{bmatrix} 1 & 0 \\ 1 & 1 \end{bmatrix},$$

denoted by $G^n$. For example, Equation (1) shows the resulting generator matrix for n=2.

$$G^{\otimes 3} = \begin{bmatrix} G2 & 0 \\ G2 & G2 \end{bmatrix} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad \text{Eq. (1)}$$

Equation (2) shows the resulting generator matrix for n=3.

$$G^{\otimes 3} = \begin{bmatrix} G2 & 0 & 0 & 0 \\ G2 & G2 & 0 & 0 \\ G2 & 0 & G2 & 0 \\ G2 & G2 & G2 & G2 \end{bmatrix} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. (2)}$$

The encoder 706 can generate a codeword by using the generator matrix to encode a number of input bits consisting of K information bits and N−K "frozen" bits which contain no information and are "frozen" to a known value, such as zero. For example, given a number of input bits $u=(u_0, u_1, \ldots, u_{n-1})$, a resulting codeword vector $x=(x_0, x_1, \ldots, x_{n-1})$ may be generated by encoding the input bits using the generator matrix G. Thus, $x[1:N]=u[1:K]*G$. This resulting codeword may then be rate matched and transmitted by a base station over a wireless medium and received by a UE. The frozen bits may be selected as the least reliable bits (e.g., the rows with the lowest weight). In one example, referring to the matrix in Eq. (2), $u=(0, 0, 0, u_3, 0, u_5, u_6, u_7)$ with $u_0, u_1, u_2,$ and $u_4$ set as frozen bits. In this example:

$$G = \begin{bmatrix} 1 & 1 & 1 & 1 & 0 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

When the received vectors are decoded, for example by using a Successive Cancellation (SC) decoder (e.g., decoder 816), every estimated bit, II, has a predetermined error probability given that bits $\hat{u}_0$-$\hat{u}_{i-1}$ were correctly decoded, that, for extremely large code size N, tends towards either 0 or 0.5. Moreover, the proportion of estimated bits with a low error probability tends towards the capacity of the underlying channel. Polar codes exploit this phenomenon, called channel polarization, by using the most reliable K bits to transmit information, while setting to a predetermined value (such as 0), also referred to as freezing, the remaining (N−K) bits, for example as explained below.

Polar codes transform the channel into N parallel "virtual" channels for the N information and frozen bits. If C is the capacity of the channel, then, for sufficiently large values of N, there are almost N*C channels which are extremely reliable and there are almost N(1−C) channels which are extremely unreliable. The basic polar coding scheme then involves freezing (i.e., setting to a known value, such as zero) the input bits in u corresponding to the unreliable channels, while placing information bits only in the bits of u corresponding to reliable channels. For short-to-medium N, this polarization may not be complete in the sense there could be several channels which are neither completely unreliable nor completely reliable (i.e., channels that are marginally reliable). Depending on the rate of transmission, bits corresponding to these marginally reliable channels may be either frozen or used for information bits.

In one example, a Polar decoder employs the successive cancellation (SC) or successive cancellation list (SCL) decoding algorithm. An SC decoding algorithm essentially operates by performing a recursive depth-first traversal of a decoding tree, to convert the bitstream 814 (e.g., a sequence of LLRs) into the message 818 corresponding to the message 702 (e.g., when the decoding is successful).

As mentioned above, CRC concatenated polar coding may be performed, whereby the encoder 706 first performed CRC encoding on the K information bits to produce K+r (information bits+checksums) CRC encoded bits and then polar encodes the K+r CRC encoded bits to produce N polar encoded bits. The CRC outer code encoder 1006a uses generator polynomial for the CRC algorithm. In one example, an example generator polynomial $x^3+x^2+1$ can be represented as a binary row vector containing the coefficients in descending orders of power, in this example, [1 1 0 1].

After the polar encoding, the first code bit x[1] is equal to the modulo-2 sum of all of the CRC output bits—regardless of the selected information bit locations of the polar code.

Because CRC code is a cyclic code, a given CRC generator polynomial $g(X)=X^r++1$, any n-length codeword can be expressed as $u(X)=a(X)g(X)$, where a(X) is the message polynomial with maximum order n-r. If the CRC generator polynomial is even weighted, then $g(X=1)=0$. Hence, $u(X=1)=a(X)*0=0$. Thus, when the CRC generator polynomial is even weighted, the resulting CRC codeword is also even weighted. In this case, the first code bit x[1] (which may be the modulo-2 sum of the CRC encoded bits) in the cascaded polar output (the N polar encoded bits) always equals to a dummy bit (e.g., always a fixed value, such as "0"), which is independent to the message (the K information bits input to the CRC encoder). Thus, the data rate of the encoder may be impacted.

Accordingly, techniques for CRC concatenated polar encoding are desirable that avoid transmission of the dummy bits.

Example Methods and Apparatus for CRC Concatenated Polar Encoding

As noted above, polar codes are a relatively recent breakthrough in coding theory and have been proven to achieve Shannon capacity for large values of a code block size N, whereas for smaller code block sizes, polar codes may suffer from poor minimum distance. Techniques such as successive cancellation list (SCL) decoding, leverage a simple outer code having excellent minimum distance, such as a cyclic redundancy check (CRC) or parity-check, on top of a polar inner code, such that the combined code has excellent minimum distance. Although the addition of CRC outer code improves the error-rate performance at low values of N, use of even-weighted CRC generator polynomials leads to additional dummy bits in the polar output as discussed above. Transmission of dummy bits may reduce the efficiency, thereby reducing processing speed and efficiency, and increasing power consumption.

Thus, aspects of the present disclosure propose techniques for avoiding transmission of dummy bits in CRC concatenated polar codes. For example, in some cases, only odd-weighted CRC generator polynomials may be selected. In some cases, when even-weighted CRC generator polynomials are used, the dummy bit may be discarded, and/or bit-level scrambling can be performed on the CRC bits to avoid generation of the dummy bit. Thereby, the encoding can achieve the benefits of minimum distance, while avoiding the transmission of dummy bits.

Figure 11:
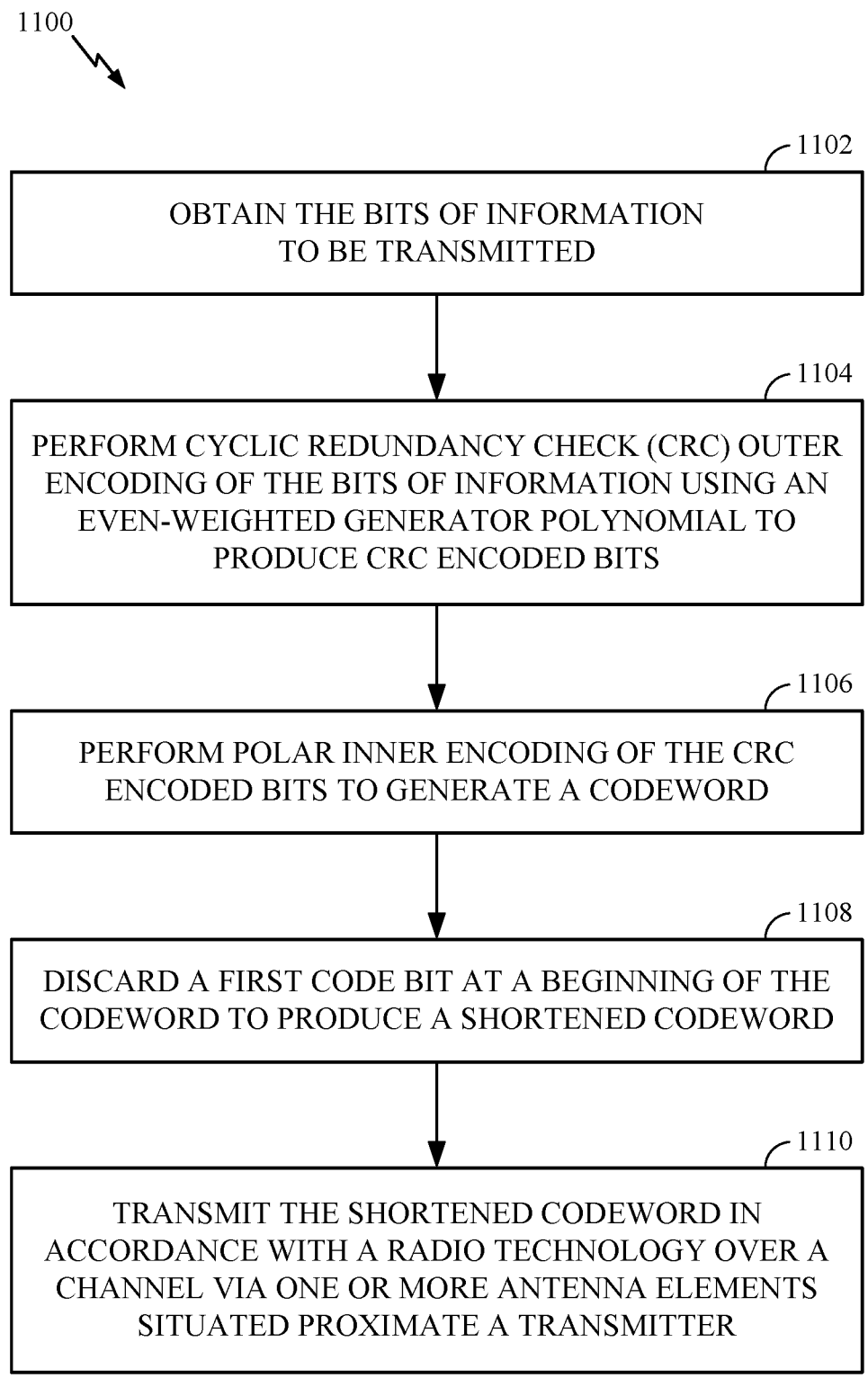
FIG. 11 illustrates example operations for CRC concatenated polar encoding bits of information including discarding a dummy bit, in accordance with certain aspects of the present disclosure.
Figure 13:
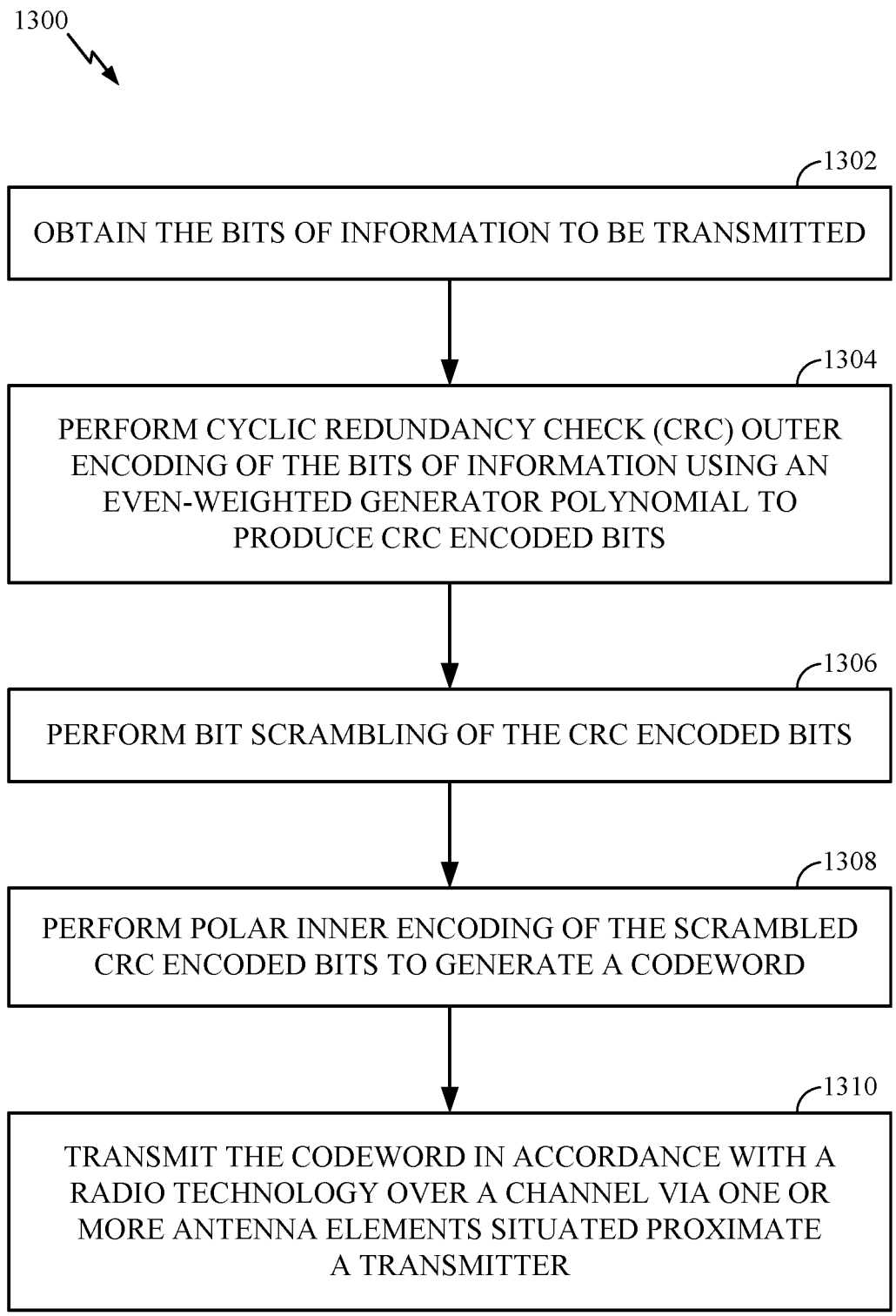
FIG. 13 is a block diagram illustrating a CRC concatenated polar encoder that discards a dummy, in accordance with certain aspects of the present disclosure.
Figure 15:
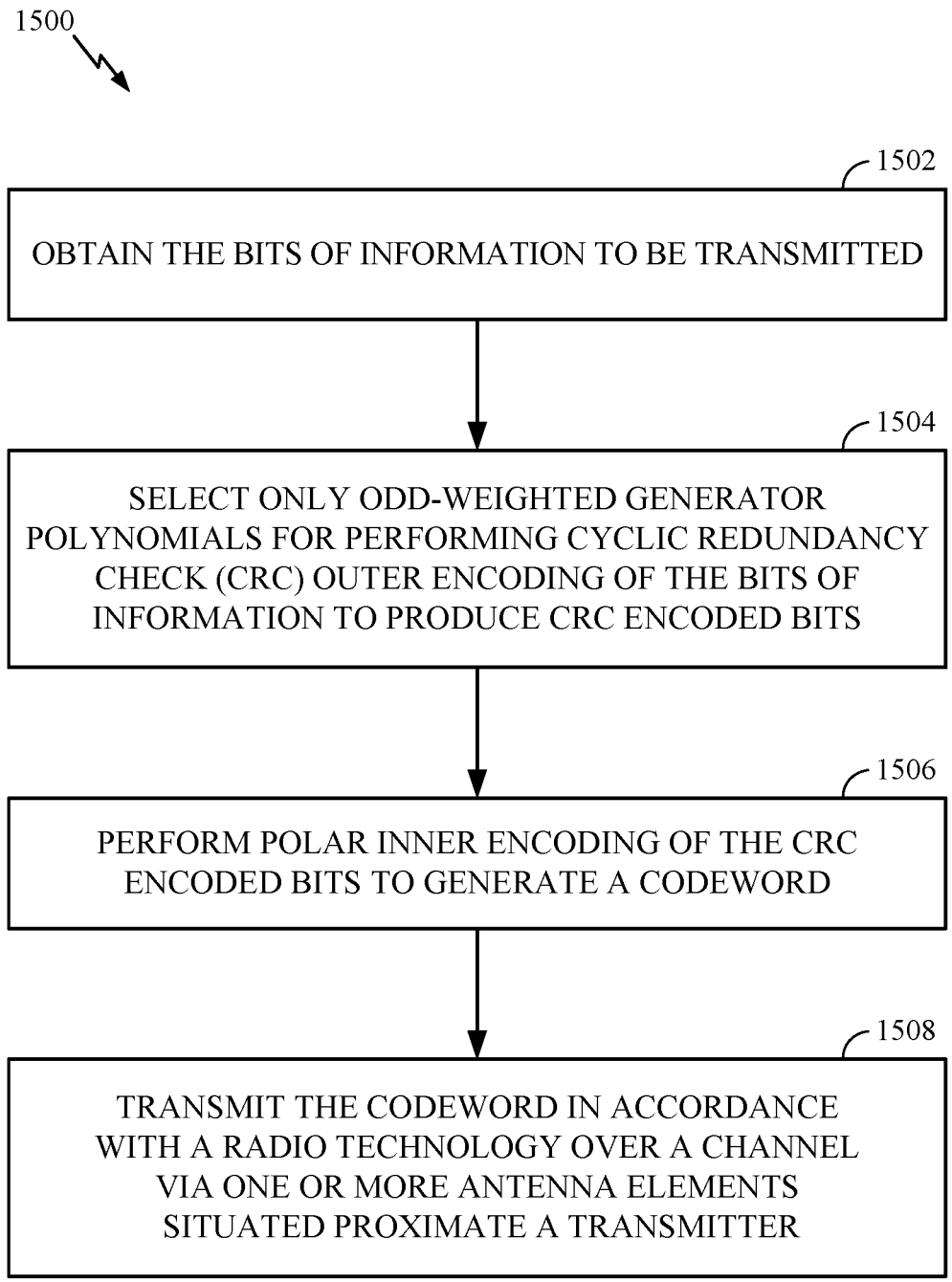
FIG. 15 is a block diagram illustrating a CRC concatenated polar encoder that performs bit level scrambling of the CRC output, in accordance with certain aspects of the present disclosure.

FIG. 11, FIG. 13, and FIG. 15 illustrate example operations 1100, 1300, and 1500, respectively, for encoding bits of information, for example, for CRC concatenated polar encoding that avoids transmission of dummy bits, in accordance with certain aspects of the present disclosure. According to certain aspects, operations 1100, 1300, and/or 1500 may be performed by any suitable encoding device, such as a base station (e.g., a BS 110 in the wireless communication network 100) on the downlink or a user equipment (e.g., a UE 120 in the wireless communication network 100) on the uplink.

The encoding device may include one or more components as illustrated in FIGS. 4, 7, 9, 12, 14, 16, and/or 18 which may be configured to perform the operations described herein. For example, the antenna 434, modulator/demodulator 432, transmit processor 420, controller/processor 440, and/or memory 442 of the BS 110, as illustrated in FIG. 4, may perform the operations described herein. Additionally or alternatively, the antenna 452, demodulator/modulator 454, transmit processor 464, controller/processor 480, and/or memory 482 of the UE 120, as illustrated in FIG. 4, may perform the operations described herein. Additionally or alternatively, the encoder 906, mapper 910, TX Chain 914, and/or antenna 918 as illustrated in FIG. 9 may be configured to perform the operations described herein.

Although not shown, complementary operations to the operations 1100, 1300, and 1500 may be performed for decoding bits of information. The complementary operations may, for example, be performed by any suitable decoding device, such as a BS (e.g., BS 110 in the wireless communication network 100) on the uplink and/or a UE (e.g., UE 120 in the wireless communication network 100) on the downlink. The decoding device may include one or more components as illustrated in FIGS. 4, 8, and 10 which may be configured to perform the operations described herein. For example, the antenna 434, modulator/demodulator 432, transmit processor 420, controller/processor 440, and/or memory 442 of the BS 110, as illustrated in FIG. 4, may perform the operations described herein. Additionally or alternatively, the antenna 452, demodulator/modulator 454, transmit processor 464, controller/processor 480, and/or memory 482 of the UE 120, as illustrated in FIG. 4, may perform the operations described herein. Additionally or alternatively, the decoder 1016, demapper 1012, RX Chain 1006, and/or antenna 1002 as illustrated in FIG. 10 may be configured to perform the complementary operations.

In one example, the first bit of the codeword may be discarded to avoid transmission of the dummy bit, even when an even-weighted CRC polynomial is used for the CRC encoding. FIG. 11 illustrates example operations 1100 for CRC concatenated polar encoding bits of information including discarding a dummy bit, in accordance with certain aspects of the present disclosure. Operations 1100 begin, at 1102, by obtaining the bits of information to be transmitted.

At 1104, the encoder performs CRC outer encoding of the bits of information using an even-weighted generator polynomial to produce CRC encoded bits.

At 1106, the encoder performs polar inner encoding of the CRC encoded bits to generate a codeword. The polar encoding may include setting one or more most reliable bits as information bits and setting one or more other bits as frozen bits.

At 1108, the encoder discards a first code bit (e.g., the x[1] bit) at a beginning of the codeword to produce a shortened codeword. The first code bit is equal to a modulo-2 sum of the CRC encoded bits. For even-weighted CRC generator polynomials, the first code bit may always be equal to a fixed bit value, such as a "0". Thus, the first code bit (e.g., the x[1] bit) may be a dummy bit. Discarding the first code bit produces the shortened codeword.

At 1110, the encoder transmits the shortened codeword in accordance with a radio technology (e.g., 5G) over a channel via one or more antenna elements situated proximate a transmitter. By discarding the dummy bit, the transmitting device avoids transmission of the dummy bit and may improve the efficiency of the transmission, while also achieving the improved minimum distance of using CRC polar encoding.

Figure 12:
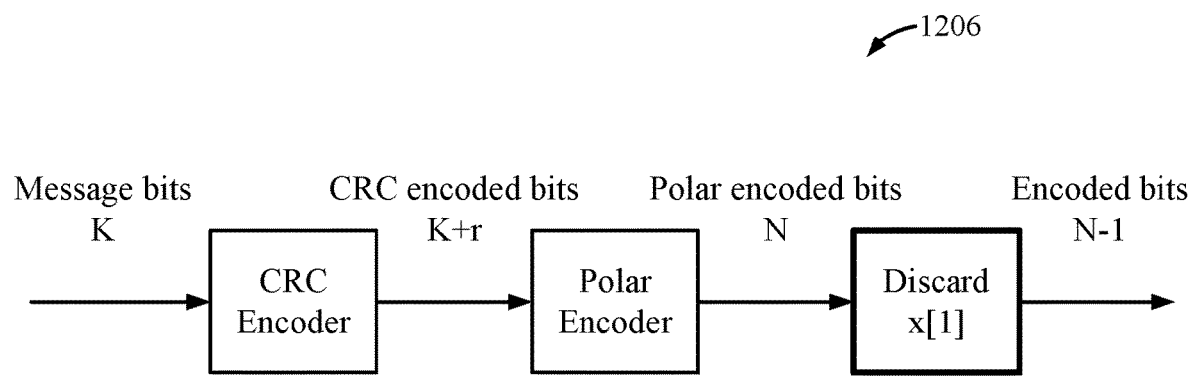
FIG. 12 is a block diagram illustrating example operations for CRC concatenated polar encoding bits of information including discarding a dummy bit, in accordance with certain aspects of the present disclosure.

As shown in FIG. 12, in some examples, the encoder 1206 may avoid transmission of dummy bits by discarding the x[1] bit of the N output polar encoded bits from the polar encoder. As mentioned above, when an even-weighted CRC generator polynomial is used, this bit is always a bit-0, independent of the K message bits input to the CRC encoder. Thus, discarding this bit may avoid transmission of the dummy bit.

In one example, the bit-level scrambling of the CRC encoded output can be done before inputting to the polar encoder to avoid generation of the dummy bit. FIG. 13 illustrates example operations 1300 for CRC concatenated polar encoding bits of information including performing bit-level scrambling of CRC encoded bits, in accordance with certain aspects of the present disclosure. Operations 1300 begin, at 1302, by obtaining the bits of information to be transmitted.

At 1304, the encoder performs CRC outer encoding of the bits of information using an even-weighted generator polynomial to produce CRC encoded bits.

At 1306, the encoder performs bit scrambling of the CRC encoded bits. The bit scrambling may ensure that a first code bit (e.g., the x[1] code bit) at a beginning of the codeword is equal to a non-zero bit at least sometimes.

At 1308, the encoder performs polar inner encoding of the scrambled CRC encoded bits to generate a codeword.

At 1310, the encoder transmits the codeword in accordance with a radio technology (e.g., 5G) over a channel via one or more antenna elements situated proximate a transmitter. By scrambling the CRC encoded bits, the transmitting device avoids generation of the dummy bit and may improve the efficiency of the transmission, while also achieving the improved minimum distance of using CRC polar encoding.

Figure 14:
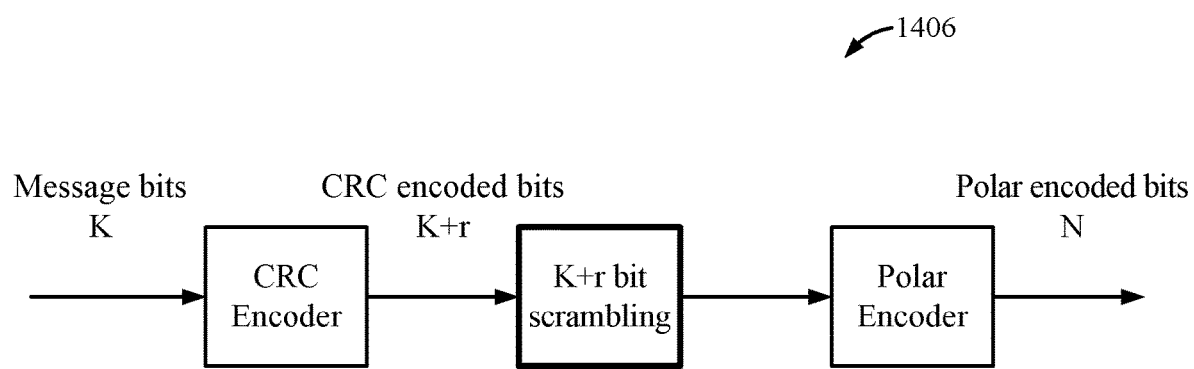
FIG. 14 illustrates example operations for CRC concatenated polar encoding bits of information including performing bit-level scrambling of CRC encoded bits, in accordance with certain aspects of the present disclosure.

As shown in FIG. 14, in some examples, the encoder 1406 may avoid transmission of dummy bits by using bit-level scrambling of the K+r CRC encoded bits output from the CRC encoder—before they are input to the polar encoder. As mentioned above, when an even-weighted CRC generator polynomial is used, the x[1] bit of the N output polar encoded bits is always a bit-0, independent of the K message bits input to the CRC encoder. However, by scrambling the K+r CRC encoded bits output by the CRC encoder, at least some of the time this bit may be non-zero and transmission of the dummy bit can be avoided. Although not shown, the scrambling may be performed by a bit scrambling module at the encoder 906.

In one example, only odd-weighted CRC generator polynomials may be selected for the CRC encoding to avoid generation of the dummy bit. FIG. 15 illustrates example operations 1500 for CRC concatenated polar encoding bits of information including selecting only odd-weighted CRC generator polynomials, in accordance with certain aspects of the present disclosure. Operations 1500 begin, at 1502, by obtaining the bits of information to be transmitted.

At 1504, the encoder selects only odd-weighted generator polynomials for performing CRC outer encoding of the bits of information to produce CRC encoded bits. The selection of only odd-weighted polynomials for performing the CRC outer encoding may ensure that a first code bit [e.g., the x[1] code bit) at a beginning of the codeword is equal to a non-zero bit at least sometimes.

At 1506, the encoder performs polar inner encoding of the scrambled CRC encoded bits to generate a codeword.

At 1508, the encoder transmits the codeword in accordance with a radio technology (e.g., 5G) over a channel via one or more antenna elements situated proximate a transmitter. By selecting only odd-weighted generator polynomials for the CRC encoding, the transmitting device avoids generation of the dummy bit and may improve the efficiency of the transmission, while also achieving the improved minimum distance of using CRC polar encoding.

Figure 16:
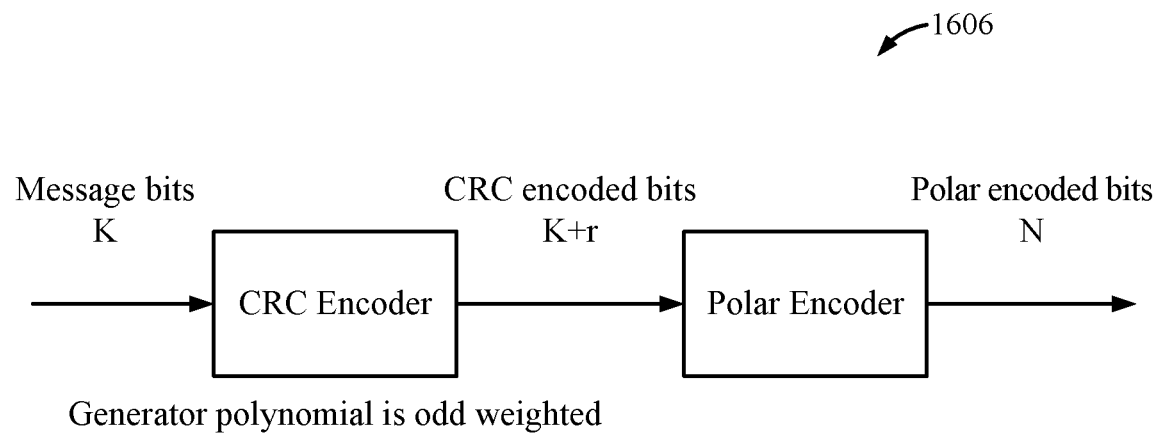
FIG. 16 illustrates example operations for CRC concatenated polar encoding bits of information using only odd-weighted CRC generator polynomials, in accordance with certain aspects of the present disclosure.

As shown in FIG. 16, in some examples, the encoder 1606 may avoid transmission of dummy bits by selecting odd-weighted CRC generator polynomial for the CRC encoding. As mentioned above, when an even-weighted CRC generator polynomial is used, the x[1] bit of the N output polar encoded bits is always a bit-0, independent of the K message bits input to the CRC encoder. Thus, by selecting an odd-weighted CRC generator polynomial for the CRC encoder, this bit may be non-zero and transmission of the dummy bit can be avoided.

Figure 17:
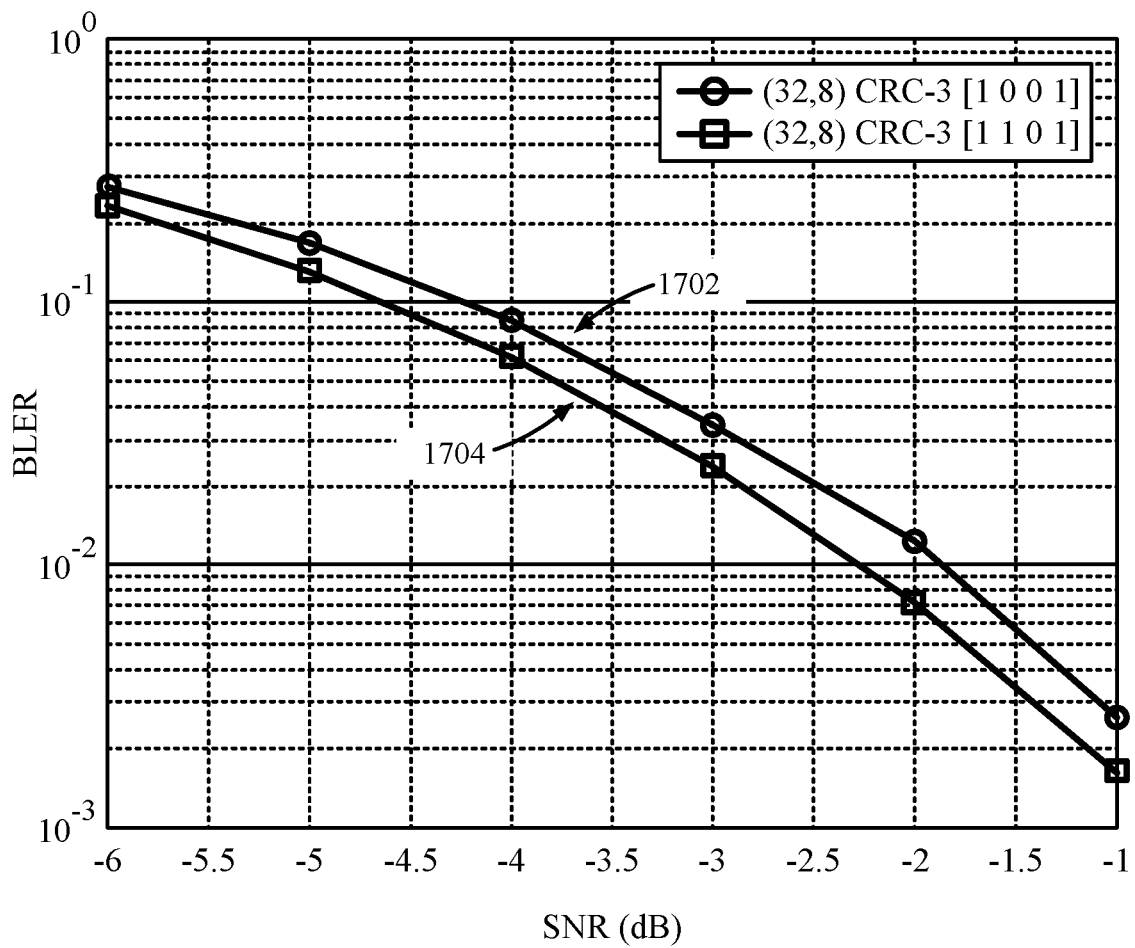
FIG. 17 is an example graph illustrating encoding performance of various CRC generator polynomials

FIG. 17 is an example graph illustrating encoding performance of various CRC generator polynomials. Curve 1702 corresponds to the even-weighted CRC 3 polynomial g(x)=[1001] and curve 1704 corresponds to the odd-weighted CRC 3 polynomial g(x)=[1101]. As shown in the graph, performance for CRC concatenated polar codes using the even-weighted CRC generator polynomial (curve 1702) has worse performance than the odd-weighted (curve 1704). Avoiding transmission of dummy bits may improve block error rate (BLER).

Figure 18:
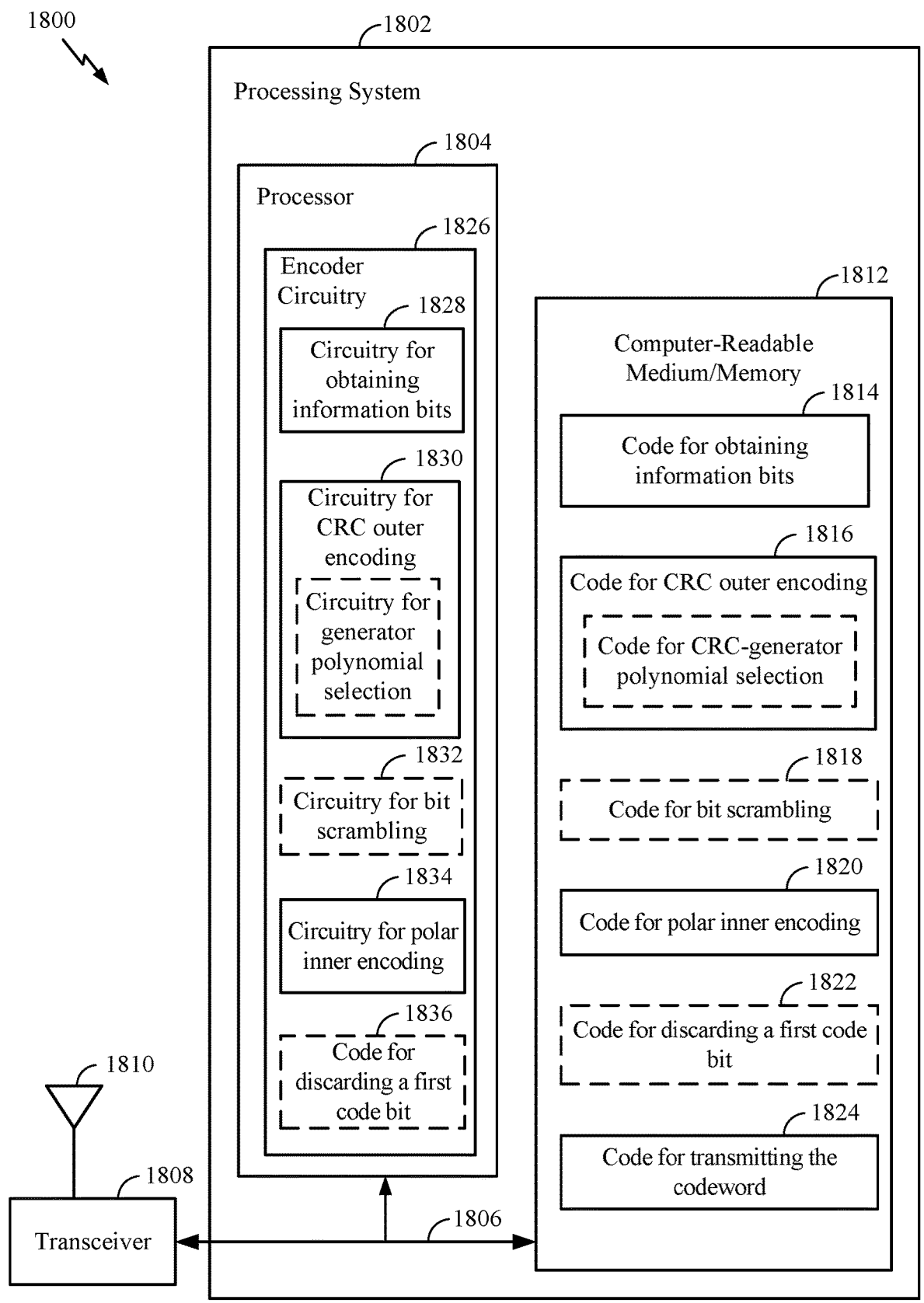
FIG. 18 illustrates a communications device that may include various components configured to perform operations for the techniques disclosed herein, in accordance with aspects of the present disclosure.

FIG. 18 illustrates a communications device 1800 that may include various components (e.g., corresponding to means-plus-function components) configured to perform operations for the techniques disclosed herein, such as the operations 1100, 1300, and 1500 illustrated in FIGS. 11, 13, and 15, respectively. The communications device 1800 includes a processing system 1802 coupled to a transceiver 1808. The transceiver 1808 is configured to transmit and receive signals for the communications device 1800 via an antenna 1810, such as the various signals as described herein. The processing system 1802 may be configured to perform processing functions for the communications device 1800, including processing signals received and/or to be transmitted by the communications device 1800.

The processing system 1802 includes a processor 1804 coupled to a computer-readable medium/memory 1812 via a bus 1806. In certain aspects, the computer-readable medium/memory 1812 is configured to store instructions (e.g., computer executable code) that when executed by the processor 1804, cause the processor 1804 to perform the operations illustrated in FIGS. 11, 13, and 15, or other operations for performing the various techniques discussed herein for avoiding transmission of dummy bits in CRC polar encoding. In certain aspects, computer-readable medium/memory 1812 stores code 1814 for obtaining information bits. The computer readable medium/memory 1812 stores code 1816 for CRC outer encoding. The code 1816 for CRC outer encoding may include code for selecting the CRC-generator polynomial (e.g., for selecting only odd-weighted polynomials in some cases). The computer readable medium/memory 1812 may store code 1818 for bit scrambling (e.g., if an even-weighted polynomial is selected). The computer readable medium/memory 1812 stores code 1820 for polar inner encoding. The computer readable medium/memory 1812 may store code 1822 for discarding a first code bit (e.g., if an even-weighted polynomial is selected). The computer readable medium/memory 1812 stores code 1824 for transmitting the codeword.

In certain aspects, the processor 1804 has circuitry configured to implement the code stored in the computer-readable medium/memory 1812. The processor 1804 includes encoder circuitry 1826. The encoder circuitry 1826 includes circuitry 1828 for obtaining information bits; circuitry 1830 for CRC outer encoding; and circuitry 1834 for polar inner encoding. The circuitry 1830 for CRC outer encoding may include circuitry for generator polynomial selection (e.g., for selecting only odd-weighted polynomials in some cases). The encoder circuitry 1826 may include circuitry 1832 for bit scrambling (e.g., if an even-weighted polynomial is selected). The encoder circuitry 1826 may include circuitry 1836 for discarding a first code bit (e.g., if an even-weighted polynomial is selected).

It should be noted that the terms distributed, inserted, interleaved may be used interchangeably and generally refer to the strategic placement of outer-code bits within an information stream inputted into an encoder, such as a Polar encoder. Additionally, it should be understood that, while aspects of the present disclosure propose techniques for reducing the search space of nodes in a polar decoding tree with relation to wireless communication system, the techniques presented herein are not limited to such wireless communication system. For example, the techniques presented herein may equally apply to any other system that uses encoding schemes, such as data storage or compression, or fiber communication systems, hard-wire "copper" communication systems, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 11, FIG. 13, and FIG. 15.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An apparatus for wireless communications, comprising:
    at least one processor coupled with a memory and comprising at least one encoder circuit configured to:
        obtain bits of information to be transmitted;
        perform cyclic redundancy check (CRC) outer encoding of the bits of information using only odd-weighted generator polynomials to produce CRC encoded bits; and
        perform polar inner encoding of the CRC encoded bits to generate a codeword; and
    a transmitter configured to transmit the codeword in accordance with a wireless technology across a channel via one or more antenna elements situated proximate the transmitter.

2. The apparatus of claim 1, wherein a first code bit of the codeword is equal to a modulo-2 sum of the CRC encoded bits.

3. The apparatus of claim 1, wherein the at least one processing being configured to perform the polar inner encoding includes the at least one processor being configured to:
- set one or more most reliable bits as information bits; and
- set one or more other bits as frozen bits.

4. The apparatus of claim 1, wherein the at least one encoder circuit is further configured to perform bit scrambling of the CRC encoded bits before the polar inner encoding is performed.

5. An apparatus for wireless communications, comprising:
- a receiver configured to obtain a codeword in accordance with a wireless technology via one or more antenna elements situated proximate the receiver; and
- at least one processor coupled with a memory and comprising at least one decoder circuit configured to:
  - perform polar inner decoding of the codeword to obtain cyclic redundancy check (CRC) encoded bits to decode the codeword; and
  - perform CRC outer decoding of the CRC encoded bits to obtain bits of information using only odd-weighted generator polynomials.

6. The apparatus of claim 5, wherein a first code bit in the codeword is equal to a modulo-2 sum of the CRC encoded bits.

7. The apparatus of claim 5, wherein the at least one decoder circuit is further configured to perform bit descrambling of the CRC encoded bits before the polar outer encoding is performed.

8. A method for wireless communications, comprising:
- obtaining bits of information to be transmitted;
- performing cyclic redundancy check (CRC) outer encoding of the bits of information using only odd-weighted generator polynomials to produce CRC encoded bits;
- performing polar inner encoding of the CRC encoded bits to generate a codeword; and
- transmitting the codeword in accordance with a wireless technology across a channel.

9. The method of claim 8, wherein a first code bit of the codeword is equal to a modulo-2 sum of the CRC encoded bits.

10. The method of claim 8, wherein performing the polar inner encoding includes:
- setting one or more most reliable bits as information bits; and
- setting one or more other bits as frozen bits.

11. The method of claim 8, further comprising:
- performing bit scrambling of the CRC encoded bits before performing the polar inner encoding.

12. A method for wireless communications, comprising:
- obtaining a codeword in accordance with a wireless technology;
- performing polar inner decoding of the codeword to obtain cyclic redundancy check (CRC) encoded bits to decode the codeword; and
- performing CRC outer decoding of the CRC encoded bits to obtain bits of information using only odd-weighted generator polynomials.

13. The method of claim 12, wherein a first code bit in the codeword is equal to a modulo-2 sum of the CRC encoded bits.

14. The method of claim 12, further comprising:
- performing bit descrambling of the CRC encoded bits before the polar outer encoding is performed.

\* \* \* \* \*